US006300212B1

(12) United States Patent
Inoue et al.

(10) Patent No.: US 6,300,212 B1
(45) Date of Patent: Oct. 9, 2001

(54) METHOD OF FABRICATING SEMICONDUCTOR DEVICE HAVING MEMORY CAPACITOR INCLUDING FERROELECTRIC LAYER MADE OF COMPOSITE METAL OXIDE

(75) Inventors: Naoya Inoue; Yoshihiro Hayashi, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/124,067

(22) Filed: Jul. 29, 1998

(30) Foreign Application Priority Data

Jul. 29, 1997 (JP) .................................................. 9-203127

(51) Int. Cl.$^7$ .................................................. H01L 21/20
(52) U.S. Cl. .................................................. 438/396; 438/3
(58) Field of Search ................................ 438/3, 240, 393, 438/241, 253, 396

(56) References Cited

U.S. PATENT DOCUMENTS

| 4,001,102 | * | 1/1977 | Batha et al. ........................ 204/186 |
| 5,043,049 | * | 8/1991 | Takenaka ............................ 204/192 |
| 5,443,030 | * | 8/1995 | Ishihara et al. ..................... 117/8 |
| 5,593,495 | * | 1/1997 | Masuda et al. ...................... 117/4 |
| 5,625,587 |   | 4/1997 | Peng et al. ........................ 365/145 |
| 5,767,541 |   | 6/1998 | Hanagasaki et al. ................ 257/295 |
| 5,929,475 |   | 7/1999 | Uemoto et al. ..................... 257/295 |
| 5,943,568 | * | 8/1999 | Fujii et al. ....................... 438/240 |
| 5,976,946 | * | 11/1999 | Matsuki et al. .................... 438/393 |

| 6,022,774 | * | 2/2000 | Kawai et al. ...................... 438/240 |

FOREIGN PATENT DOCUMENTS

| 4-79266 | 3/1992 | (JP) . |
| 4-80959 | 3/1992 | (JP) . |
| 4-113621 | 4/1992 | (JP) . |
| 5-63153 | 3/1993 | (JP) . |
| 5-206382 | 8/1993 | (JP) . |
| 7-14986 | 1/1995 | (JP) . |
| 7-172996 | 7/1995 | (JP) . |
| 8-250503 | 9/1996 | (JP) . |
| 9-27601 | 1/1997 | (JP) . |
| 9-45877 | 2/1997 | (JP) . |
| 9-51077 | 2/1997 | (JP) . |
| 9-107079 | 4/1997 | (JP) . |
| 9-172150 | 6/1997 | (JP) . |

* cited by examiner

Primary Examiner—David Nelms
Assistant Examiner—David Nhu
(74) Attorney, Agent, or Firm—Foley & Lardner

(57) ABSTRACT

In a method and an apparatus for manufacturing a semiconductor device which has a capacitor consisting of a layered structure of a lower electrode, a ferroelectric layer made of a composite metal oxide such as PZT and an upper electrode in a predetermined region on a semiconductor substrate, the lower electrode, the ferroelectric layer and the upper electrode are successively formed in an atmosphere isolated from the air. For the duration after forming the ferroelectric layer till starting the formation of the upper electrode, it is desirable to introduce a gas such as an inert gas or an inert gas with oxygen into the atmosphere in the vicinity of the substrate to keep the atmosphere within a predetermined pressure range.

34 Claims, 8 Drawing Sheets

METHOD OF FABRICATING SEMICONDUCTOR DEVICE HAVING MEMORY CAPACITOR INCLUDING FERROELECTRIC LAYER MADE OF COMPOSITE METAL OXIDE

BACKGROUND OF THE INVENTION (i) Field of the Invention

The present invention relates to method of fabricating a semiconductor device, particularly to a method of fabricating a semiconductor memory device having a memory capacitor including a dielectric layer is made of a composite metal oxide.

(ii) Description of the Related Art

It is prevalent to develop semiconductor memory devices in which ferroelectric thin films made of composite metal oxides or thin films having high dielectric constant capacities made of composite metal oxides are used for the dielectric layers of memory capacitors. With miniaturization of semiconductor devices in recent years, it becomes an issue how small area the necessary capacitance of each memory capacitor is ensured by in a dynamic random access memory (DRAM) for instance. One of solutions of this problem is a method that the dielectric substance used as the dielectric layer of each memory capacitor is changed from conventional silicon oxide, silicon nitride or the like to a substance having a higher dielectric constant capacitance. It is expected that substances having high dielectric constant capacities such as $SrTiO_3$ or ferroelectric substances such as $Pb(Zr,Ti)O_3$ (hereinafter, called PZT) are useful for this purpose.

Besides, when a ferroelectric substance is used for the dielectric layer of each memory capacitor, a new function of non-volatility can be added to the semiconductor memory device. The dielectric layer of the ferroelectric substance has the following characteristic. When a voltage is applied to polarize the dielectric layer, the polarization does not become zero and remains even after stopping applying the voltage. By utilizing the remaining polarization, the memory device including the dielectric layer of the ferroelectric substance can be used as a non-volatile memory. The basic structure of such a ferroelectric non-volatile memory includes a MOS field effect transistor (MOSFET) and a ferroelectric capacitor in each memory cell. It has many common points in structure and manufacturing method with a general dynamic memory. Hereinafter, prior arts of the nonvolatile memories using ferroelectric substances will be described.

The structures and manufacturing methods of conventional ferroelectric memory devices are as follows.

FIG. 16 shows the structure of a conventional ferroelectric memory device disclosed by Japanese Patent Opening No. 80959/1992. As shown in FIG. 16, a MOS transistor comprises a gate electrode 15 and diffusion layers 16 in a region separated by a LOCOS insulator 24 on a silicon substrate 11. A ferroelectric capacitor comprises a lower electrode 18 made of platinum (Pt), a ferroelectric layer 19 and an upper electrode 27 made of aluminum (Al). The ferroelectric capacitor is electrically connected to one of the diffusion layers 16 of the MOS transistor through a titanium silicide layer 25. The ferroelectric layer 19 is made of $PbTiO_3$, PZT, $(Pb,La)(Zr,Ti)O_3$ (hereinafter, called PLZT) or the like. The transistor part, the capacitor part and wiring parts are insulated from one another by an inter-layer insulator 13 comprising two layers of silicon oxides for instance.

The ferroelectric memory of this first prior art is generally manufactured by the following process. First, the transistor is formed by the conventional manner in the region separated by the LOCOS insulator 24 on the silicon substrate 11 and the lower inter-layer insulator 132 is formed thereon. Successively, a part of the lower inter-layer insulator 132 is opened to expose one of the diffusion layers 16 of the transistor in the opening. The ferroelectric capacitor is formed on the opening portion of the lower inter-layer insulator 132 to be electrically connected to the transistor. In this prior art, a titanium layer 26 is formed in the opening and then a thermal treatment is performed. By this manner, the part of the titanium layer 26 contacting the diffusion layer 16 is silicified to obtain the titanium silicide layer 25. This is for lowering the contact resistance between the diffusion layer of the transistor and the electrode of the capacitor to be formed thereon. Next, a Pt layer to form the lower electrode 18 and, for instance, a PZT layer to form the ferroelectric layer 19 are formed in order on the titanium silicide layer 25. In this prior art, these are both formed by sputtering methods. Successively, the Pt layer and the PZT layer are patterned by a photolithographing and etching process to obtain the lower electrode 18 and the ferroelectric layer 19. After forming the upper inter-layer insulator 131, a part of it is opened by an etching process using plasma to expose the ferroelectric layer 19 in the opening. An aluminum (Al) layer is formed by sputtering so as to fill up the opening and thereby an aluminum wiring layer 27 combining the upper electrode 20 and a bit line is obtained.

As the second prior art, a ferroelectric memory device constructed as shown in FIG. 17 is used (Japanese Patent Opening No. 79266/1992). In the prior art shown in FIG. 17, a ferroelectric capacitor comprising a lower electrode 18, a ferroelectric layer 19 and an upper electrode 20 is formed at a position distant from the just upper position of a diffusion layer 16 of a transistor. The ferroelectric capacitor is electrically connected to the diffusion layer 16 through a wiring metal layer 22.

The manufacturing process of the prior art shown in FIG. 17 is as follows. The transistor 14 is formed on a silicon substrate 11 by a conventional manner. An inter-layer insulator 13 of, for instance, silicon oxide is formed. A Pt layer is first formed on the inter-layer insulator 13 by sputtering and then patterned by a photolithographing and etching process so that it remains only in a predetermined region in which the capacitor is to be formed. The lower electrode 18 is thereby formed. Similarly, a ferroelectric layer is formed on the whole area and then patterned by a photolithography process so that it remains only in the region required for forming the capacitor. The ferroelectric layer 19 is thereby formed. The ferroelectric layer 19 is then treated with heat to crystallize. The reason why the thermal treatment is performed after patterning is as follows. It becomes possible to control to the minimum the stress due to the shrinkage of the volume of the layer upon crystallization and the exfoliation of the ferroelectric layer does not occur. After that, another Pt layer is formed by sputtering and then patterned by a photolithography process so that it remains only in the region first formed on the inter-layer insulator 13 by sputtering and then patterned by a photolithographing and etching process so that it remains only in the region required for forming the capacitor. The upper electrode 20 is thereby formed. At the last, a part of the inter-layer insulator 13 is opened to expose the diffusion layer of the transistor. An aluminum layer is formed on the inter-layer insulator 13 including the opening portion and then patterned into a predetermined shape to obtain the wiring layer.

But the conventional manufacturing methods of the semiconductor devices including the ferroelectric capacitors have the following problem. There is a deterioration in reliability due to a contamination of the ferroelectric layer and a change of the composition thereof.

In the conventional manufacturing methods including the above examples, it is general to form the lower electrode, ferroelectric layer and upper electrode constituting the ferroelectric capacitor in separate apparatus. In this manner, for instance, the substrate on which the ferroelectric layer had been formed in an apparatus for forming the ferroelectric layer is once taken out in the air and then put in an apparatus for forming the upper electrode. Accordingly, the ferroelectric layer is inevitably exposed to the air between both stages so the surface of the ferroelectric layer is contaminated with floating matters in the air.

Besides, in the above prior arts, after the ferroelectric layer is formed on the whole area of the substrate, it is patterned so that only the part of it used for the capacitor remains. That is, the substrate after forming the ferroelectric layer is taken out in the air and then coated with a resist. In this case, the surface of the ferroelectric layer is contaminated not only upon being taken out in the air but also with the resist applied in the photolithography process. Although the resist is removed after completing the patterning process, it is hard completely to remove the contamination of the surface of the ferroelectric layer.

As described above, the surface of the ferroelectric layer is contaminated by exposing the substrate after forming the ferroelectric layer to the air or performing the patterning process using the resist. Similar contamination occurs also on the surface of the lower electrode. In the case that the substrate after forming the lower electrode is taken out in the air or the patterning process of the lower electrode is performed, the surface of the lower electrode is contaminated. Such contamination finally remains in the boundary surface between the ferroelectric layer and the upper or lower electrode to deteriorate the electric performance and reliability of the ferroelectric capacitor.

In addition to the above problem, there is another problem that it is easy to change the composition of the ferroelectric layer because composing elements come off from the surface of the ferroelectric layer formed.

Conventionally in the case of forming the ferroelectric layer by a sputtering method, a chemical vapor deposition (CVD) method or the like, it is general to heat the substrate to a high temperature and evacuate the reaction chamber, in which the substrate is put, after completing the formation of the ferroelectric layer. But the substrate immediately after the formation of the ferroelectric layer is still at a high temperature so elements composing the ferroelectric layer are easy to come off from the surface of the ferroelectric layer. Thus metal elements having a relatively high vapor pressure such as lead (Pb) in PZT for instance and oxygen easily come off from the surface of the ferroelectric layer and this causes a change of the composition of the surface portion.

On the other hand, there is also a case that a change of the composition of the surface portion of the ferroelectric layer is caused by a process after that. For instance, when a process such as an etching process using plasma and a forming process of the upper electrode using plasma is carried out after forming the ferroelectric layer, oxygen and so on come off from the surface of the ferroelectric layer because the surface of the ferroelectric layer is exposed to plasma. This causes a change of the composition of the surface portion of the ferroelectric layer.

Such a change of the composition of the surface portion of the ferroelectric layer also causes deterioration in electric performance and reliability of the ferroelectric capacitor.

Furthermore, in the above prior art manufacturing methods, because the layered structure is formed with plural apparatus, there is a problem that the manufacturing cost is high and the productivity is low.

Hereinabove, there were described the problems of the manufacturing methods of the semiconductor devices including the ferroelectric capacitors. Just similar problems are present in the case of semiconductor devices in which substances of composite metal oxides having high ferroelectric constant capacities are used for the capacitors.

It is an object of the present invention to provide a method and an apparatus for manufacturing a semiconductor device in which the surface of a ferroelectric layer can be prevented from being contaminated and changing the composition in the case that a ferroelectric substance of composite metal oxide or a substance of composite metal oxide having a high ferroelectric constant capacitance is used for the ferroelectric layer of a capacitor.

It is another object of the present invention to provide a method and an apparatus for manufacturing a semiconductor device with a high productivity and thereby to provide a semiconductor device of a high performance and a high reliability at a low cost.

According to the present invention, a method for manufacturing a semiconductor device which includes a capacitor made of a layered structure of a lower electrode layer, a ferroelectric layer made of a composite metal oxide and an upper electrode layer in a predetermined region on a semiconductor substrate, is characterized by comprising a step of successively forming the lower electrode layer, the ferroelectric layer and the upper electrode layer in an atmosphere isolated from the air. The step of successively forming may be followed by a patterning step in which the layered structure is processed by etching to leave the layered structure only in the region used for the capacitor. The patterning step may be followed by a step of a thermal treatment in the atmosphere of oxygen, an inert gas or a mixture of them.

In the above step of successively forming the lower electrode layer, the ferroelectric layer and the upper electrode layer, it is effective to introduce a gas in the vicinity of the substrate and keep the pressure in a predetermined range for at least the duration after completing the formation of the ferroelectric layer till starting the formation of the upper electrode layer. For such a gas to be introduced, an inert gas or a mixture of an inert gas and oxygen is desirable. The pressure of the atmosphere in the vicinity of the substrate is desirably in the range from $10^{-4}$ Torr to 10 Torr. In the case of forming the upper electrode layer by a sputtering method, it is effective that the sputtering gas contains oxygen upon starting the formation of the upper electrode layer.

The above method for manufacturing a semiconductor device is effective particularly to the case that a ferroelectric substance is used for the ferroelectric layer of the composite metal oxide. Lead titanate zirconate is usable for such a ferroelectric substance.

In the case of forming the ferroelectric layer by a sputtering method, the productivity can be improved by the manner that the formation of the ferroelectric layer is started by a low electric power and then performed with increasing the electric power.

According to the present invention, a method for manufacturing a semiconductor device which includes a ferroelectric layer made of lead titanate zirconate, is characterized in that the ferroelectric layer is formed at a substrate temperature at which lead titanate zirconate is in pyrochlore structure and then a thermal treatment is performed in the atmosphere of oxygen, an inert gas or a mixture of them at a higher temperature than the substrate temperature upon the formation of the ferroelectric layer to change the phase of lead titanate zirconate from pyrochlore structure to perovskite structure. A temperature within the range from 300° C. to 550° C. is suitable for the temperature for forming the ferroelectric layer. A temperature within 580° C. to 800° C. is suitable for the thermal treatment. This manufacturing method is more effective if it is performed with the above manufacturing method in which the layered structure of the upper electrode, ferroelectric layer and lower electrode is successively formed. In that case, it is desirable to perform the thermal treatment after the patterning process of the capacitor portion.

According to the present invention, an apparatus for manufacturing a semiconductor device, is characterized in that the apparatus comprises a substrate transfer chamber, a lower electrode formation chamber capable of transferring a substrate from and to the substrate transfer chamber, a ferroelectric layer formation chamber capable of transferring a substrate from and to the substrate transfer chamber, and an upper electrode transfer chamber capable of transferring a substrate from and to the substrate transfer chamber, and it is possible to keep the atmospheres in the substrate transfer chamber, the lower electrode formation chamber, the ferroelectric layer formation chamber and the upper electrode transfer chamber isolated from the air and to keep the atmosphere in the formation chamber in which a substrate after forming a ferroelectric layer and before forming an upper electrode is present or the substrate transfer chamber, at an oxygen pressure at which the partial pressure of a metal element composing the ferroelectric layer in the vicinity of the surface of the ferroelectric layer is not less than the equilibrium vapor pressure of the metal element.

In the manufacturing method according to the present invention, the lower electrode layer, the ferroelectric layer and the upper electrode layer are successively formed in the pure atmosphere isolated from the air. Thus, the surface of the ferroelectric layer is not exposed to the air, which may cause contamination. Besides, because the capacitor portion is patterned after forming the layered structure, it is possible to prevent the surface of the ferroelectric layer from being contaminated with a resist. Therefore, according to the method of the present invention, no contamination occurs on the boundary surface between the ferroelectric layer and the upper or lower electrode. Besides, because the layered structure can be formed in one apparatus, it is needless to transfer substrates between plural apparatus so it is possible to lower the manufacturing cost and improve the productivity.

When the atmosphere in the vicinity of the substrate is not a vacuum but kept within a fixed pressure range for the duration after completing the formation of the ferroelectric layer till starting the formation of the upper electrode, the surface portion of the ferroelectric layer can be prevented from changing the composition. If the substrate after completing the formation of the ferroelectric layer is taken out in a vacuum as it is at a high temperature, composing metal elements having high vapor pressures come off from the surface of the ferroelectric layer to change the composition of the surface portion of the erroelectric layer. This may be prevented if the partial pressure of each element composing the ferroelectric layer in the vicinity of the surface of the ferroelectric layer is so controlled as to be not less than the equilibrium vapor pressure of the element at the substrate temperature. But it is very hard to increase the partial pressure of each metal element composing the ferroelectric layer in the apparatus by introducing the element as a gas. The present invention is made by finding that substantially the same effect can easily be obtained when an ordinary gas, for instance, an inert gas is introduced in the film formation apparatus to keep the vicinity of the substrate at a constant pressure. This phenomenon is considered as follows. When the inert gas is introduced to keep the vicinity of the substrate at a constant pressure, the average free distance of the gaseous molecules in the film formation chamber including the vicinity of the surface of the substrate is shortened. Thus it becomes possible to prevent the composing elements of the ferroelectric layer from coming off from the ferroelectric layer. For the gas to be introduced, an inert gas such as argon which does not react with the composing element of the ferroelectric layer is desirable. Mixing the inert gas with oxygen is effective for preventing oxygen from coming off from the surface of the ferroelectric layer. Furthermore, in the case of forming the upper electrode by a sputtering method, by mixing oxygen with the sputtering gas in the beginning of the formation of the upper electrode, it is possible to prevent oxygen from coming off due to exposure of the ferroelectric layer to plasma upon the formation of the upper electrode. According to the above method of the present invention, it is possible to prevent the surface portion of the ferroelectric layer from changing the composition.

In the case of the ferroelectric layer of PZT, it is effective to employ a two-stage film formation method in which the substrate temperature is controlled to a low temperature upon forming the ferroelectric layer and then a thermal treatment is performed to obtain a ferroelectric phase. For obtaining a ferroelectric thin film of PZT in perovskite structure, a high substrate temperature more than about 600° C. is required in general. If the ferroelectric layer is formed at such a high substrate temperature, coming-off of the composing elements of the ferroelectric layer from the surface of the ferroelectric layer after the formation of the ferroelectric layer is active as a matter of course and the change of the composition of the surface portion of the ferroelectric layer becomes large. According to the present invention, however, because the ferroelectric layer can be formed at a low substrate temperature in the extent of 300–550° C., coming-off of the composing elements from the surface of the PZT film after the formation is gentle and the composition is hard to change. The PZT film formed at this condition is in pyrochlore structure showing paraelectricity. The PZT film in pyrochlore structure can be changed in phase to perovskite structure by a thermal treatment at a temperature in the extent of 580–800° C. If such a thermal treatment is performed after forming the upper electrode, the change of the composition of the surface portion of the PZT film can be prevented.

DETAILED DESCRIPTION OF THE PREFERRED EMBODIMENTS

Hereinafter, embodiments of the present invention will be described with reference to drawings.

EXAMPLE 1

Here, the first example of the present invention will be described in detail. In this example, a semiconductor device in which a ferroelectric substance was used for a ferroelectric layer was manufactured.

Figure 1:
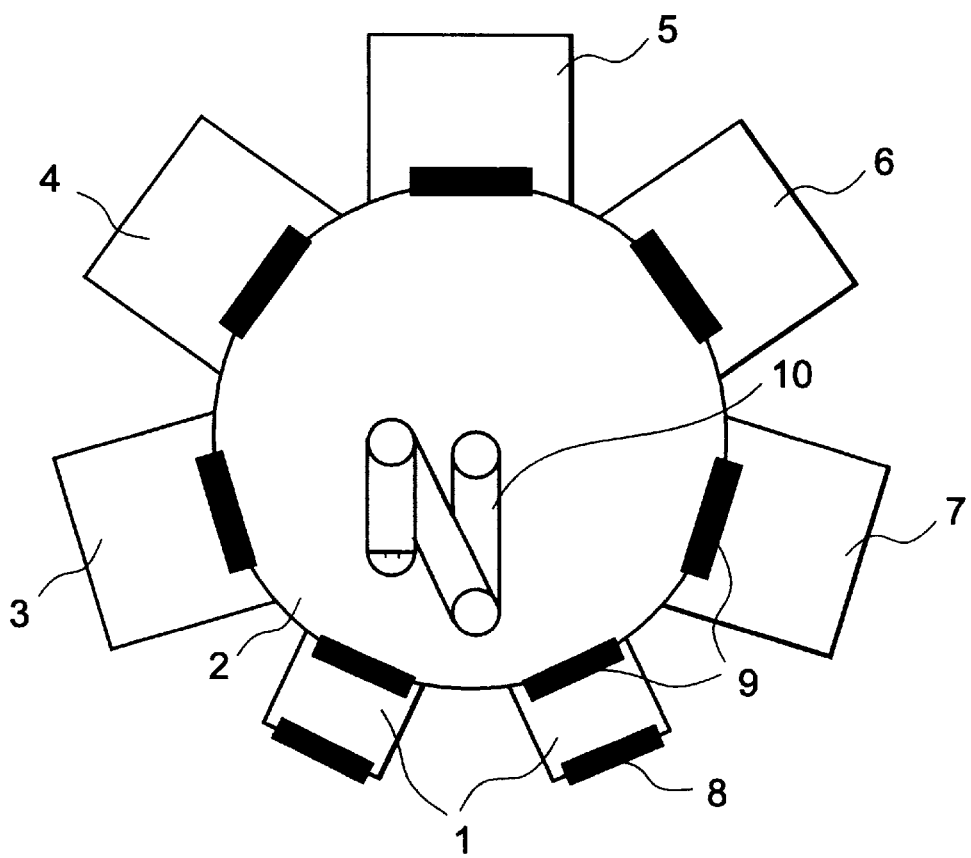
FIG. 1 is a schematic view of an apparatus for manufacturing a semiconductor device according to the present invention.

FIG. 1 shows a film formation apparatus according to the present invention used in this example. In this film formation apparatus, a substrate transfer chamber 2 is located at the center and two substrate exchange chambers 1 and treatment chambers 3 to 7 are disposed on the periphery of the substrate transfer chamber 2 through valves 9, respectively. The substrate exchange chambers 1, the substrate transfer chamber 2 and the treatment chambers 3 to 7 are provided with vacuum pumps and capable of being evacuated to a high-degree vacuum not more than $10^{-6}$ Torr, respectively. A transfer arm 10 is provided in the substrate transfer chamber 2. A substrate can be taken in to and out from any of the substrate exchange chambers 1 and treatment chambers 3 to 7 with the transfer arm 10. As the treatment chambers 3 to 7, proper treatment apparatus such as sputtering apparatus and etching apparatus can be connected. In this example, as the treatment chambers 4, 5 and 6, a direct-current sputtering apparatus for forming a lower electrode, a high-frequency sputtering apparatus for forming a ferroelectric layer and a direct-current sputtering apparatus for forming an upper electrode were connected, respectively, and the treatment chambers 3 and 7 were not used. Hereinafter, the treatment chambers 4, 5 and 6 are called lower electrode formation chamber, ferroelectric layer formation chamber and upper electrode formation chamber, respectively. Each of the substrate exchange chambers 1 is provided with a release door 8 for taking substrates in and out. In this and the below examples, the substrate exchange chamber left in the drawing was used for taking in untreated substrates to the apparatus and the substrate exchange chamber right in the drawing was used for taking out substrates had been treated to the outside of the apparatus. Hereinafter, they are called substrate taking-in chamber and substrate taking-out chamber, respectively. Each of the film formation chambers, substrate transfer chamber and substrate exchange chambers is provided with a necessary evacuation system and a necessary gas introduction system.

By performing film formation steps in the following process with the apparatus of FIG. 1, it is possible to form a layered structure of a lower electrode, a ferroelectric layer and an upper electrode in the atmosphere perfectly isolated from the air.

At first, a predetermined number of substrates is put in the substrate taking-in chamber and then the chamber is sufficiently evacuated after the release door 8 is closed. The substrate transfer chamber 2 and the film formation chambers are sufficiently evacuated in advance. After that, one of the substrates put in the substrate taking-in chamber is taken out from there with the transfer arm 10 and put in the lower electrode formation chamber 4 through the substrate transfer chamber 2. After forming a lower electrode in the lower electrode formation chamber 4, the substrate is taken out from the lower electrode formation chamber 4 to the substrate transfer chamber 2 and then put in the ferroelectric layer formation chamber 5. After forming a ferroelectric layer in the ferroelectric layer formation chamber 5, the substrate is taken out from the ferroelectric layer formation chamber 5 to the substrate transfer chamber 2 and then put in the upper electrode formation chamber 6. For the duration after completing the formation of the dielectric layer till starting the formation of an upper electrode, the film formation chambers in which the substrate is present and the substrate transfer chamber can be kept at a fixed pressure by introducing argon or a mixture gas of argon and oxygen therein. After completing the formation of the upper electrode, the substrate is taken out from the upper electrode formation chamber 6 to the substrate transfer chamber 2 and then transferred to the substrate taking-out chamber. The above process is performed as to each of the substrates put in the substrate taking-in chamber. At the last, the release door 8 of the substrate taking-out chamber is opened to take out the substrates had been treated. In the above process, each of the valves 9 provided between each of the film formation chambers and substrate exchange chambers and the substrate transfer chamber is operated so that it is opened only when the substrate is taken in or out and closed in the other time.

Hereinafter, the structure of a semiconductor device using a ferroelectric capacitor made in this example and a method for manufacturing it will be described with reference to FIGS. 2 to 7. FIGS. 2 to 7 show cross sections in principal steps in order. At first, the final structure of the semiconductor device made in this example will be described with reference to FIG. 7.

A transistor 14 comprising a pair of diffusion layers 16 and a gate electrode 15 is formed on a silicon substrate 11 and electrically isolated from the other regions by an isolating region 12. An inter-layer insulator 13 is formed on the transistor portion. A ferroelectric capacitor is formed on the inter-layer insulator 13 at a position distant from the transistor portion. The ferroelectric capacitor comprises a lower electrode 18, a ferroelectric layer 19 and an upper electrode 20. A close adhesion layer 17 is disposed between the inter-layer insulator 13 and the lower electrode 18. The close adhesion layer 17 is used for improving the adhesion between the inter-layer insulator 13 and the lower electrode 18 of the ferroelectric capacitor. A capacitor cover insulator 21 is formed on the upper portion of the ferroelectric capacitor. Wiring layers are formed to connect one of the diffusion layers 16 of the transistor portion to the upper electrode 20 of the ferroelectric capacitor, the other of the diffusion layers 16 to the exterior and the lower electrode 18 of the ferroelectric capacitor to the exterior through contact holes formed in the capacitor cover insulator 21.

Next, the method for manufacturing the semiconductor memory device including the ferroelectric capacitor according to the present invention will be described with reference to FIGS. 2 to 7.

Figure 2:
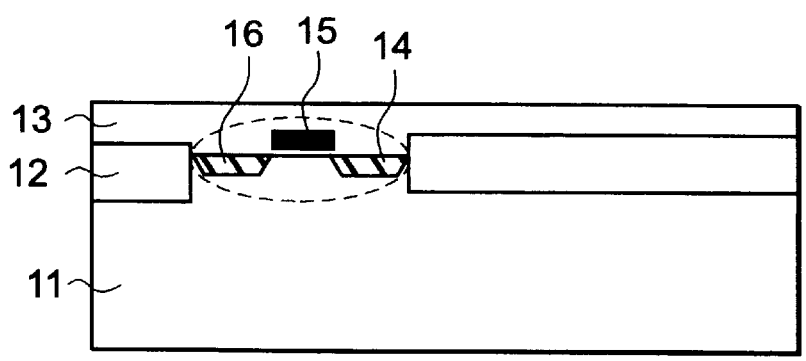
FIG. 2 is a cross-sectional view of a semiconductor device in a manufacturing step in the first example of the present invention.

In each of this and the below examples, a semiconductor memory device was manufactured by using a p-type silicon substrate of the diameter of about 15 cm. At first, as shown in FIG. 2, a MOS-type transistor 14 is formed by a conventional method in a region electrically isolated by an isolating region 12 such as trench isolating oxide on a p-type silicon substrate 11. The transistor 14 comprises a pair of diffusion layers 16 and a gate electrode 15. Next, an inter-layer insulator 13 made of, for instance, silicon oxide is formed on the whole area of the substrate including the upper surface of the transistor portion and then leveled by a chemical mechanical polishing (CMP) method.

Figure 3:
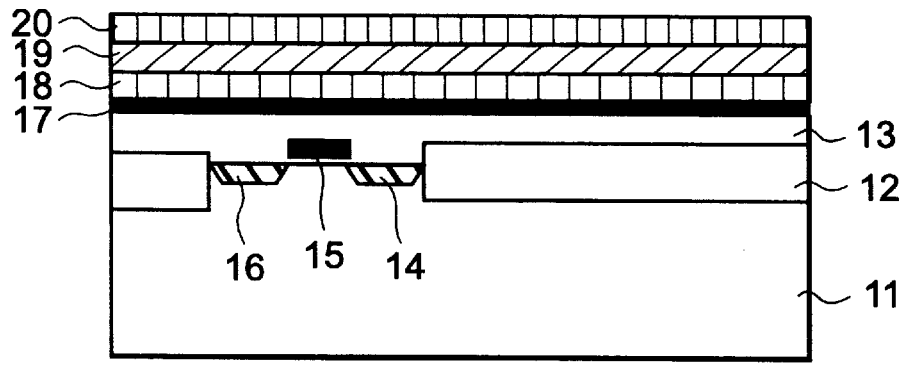
FIG. 3 is a cross-sectional view of the semiconductor device in a manufacturing step in the first example of the present invention.

Next, as shown in FIG. 3, a close adhesion layer 17 and a lower electrode 18, a ferroelectric layer 19 and an upper electrode 20 comprising a ferroelectric capacitor are formed in order on the inter-layer insulator 13 to form a layered structure. The close adhesion layer 17 is used for improving the adhesion between the inter-layer insulator 13 and the lower electrode 18 and preventing coming-off of the layered structure or the like. In this example, iridium oxide ($IrO_2$) was used for the close adhesion layer 17, iridium for the lower electrode 18, PZT (Zr/Ti=53/47) for the ferroelectric layer 19, and iridium for the upper electrode 20 similarly to the lower electrode 18. Hereinafter, this film formation process will be described in detail.

At first, an iridium oxide layer is formed on the interlayer insulator 13 by a direct-current sputtering method. In this example, a direct-current sputtering apparatus other than those in the film formation apparatus of FIG. 1 was used and the iridium oxide layer for the close adhesion layer 17 was formed by a reactive sputtering method in which metallic iridium was employed for the target and argon and oxygen were employed for the sputtering gas. The thickness of the close adhesion layer 17 was 20 nm.

The substrate is then taken in to the film formation apparatus of FIG. 1 and an iridium layer for the lower electrode 18, a PZT layer for the ferroelectric layer 19 and an iridium layer for the upper electrode 20 are successively formed. The film formation process in the apparatus of FIG. 1 is as follows.

At first, the iridium layer for the lower electrode 18 is formed in the lower electrode formation chamber 4. In this example, a direct-current sputtering apparatus was disposed as the lower electrode formation chamber 4 and the formation was performed with the target of iridium and the spattering gas of argon. The thickness of the lower electrode 18 was 200 nm.

The formation of the PZT layer for the ferroelectric layer 19 is then performed. The substrate after completing the formation of the lower electrode is taken out from the lower electrode formation chamber 4 and then put in the ferroelectric layer formation chamber 5. In this example, a high-frequency sputtering apparatus was used as the ferroelectric layer formation chamber 5. A PZT ceramic was employed for the sputtering target. An $Ar/O_2$ mixture gas in which oxygen ($O_2$) was added to argon generally used was employed for the sputtering gas. This is because the lack of oxygen in the PZT layer, which is a composite metal oxide, can be restrained by adding oxygen to the sputtering gas and a good ferroelectric performance can be obtained. Besides, by the addition of $O_2$, it becomes possible to prevent the surface of the target from changing in quality. Typical film formation conditions are as follows. The sputtering gas is $Ar/O_2$ (10%), the substrate temperature is 600° C. and the high-frequency electric power is 1 kW. In the ferroelectric layer formation chamber 5 of this example, the diameter of the target was 314 mm and the distance between the target and substrate was 100 mm. Thus, if the high-frequency electric power is expressed with the density normalized by the volume in which the plasma is present, the electric power of 1 kW is expressed into 0.129 $kW/cm^3$. In this example, the thickness of the PZT layer was 200 nm.

Figure 8:
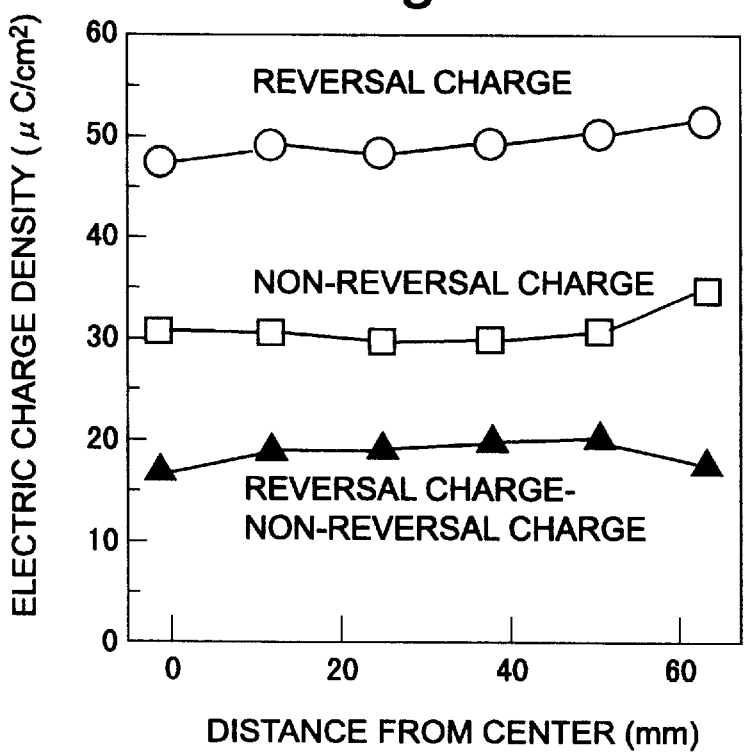
FIG. 8 is a graph showing the distribution in the substrate surface of the capacitance characteristics of a PZT film formed in the first example of the present invention.
Figure 9:
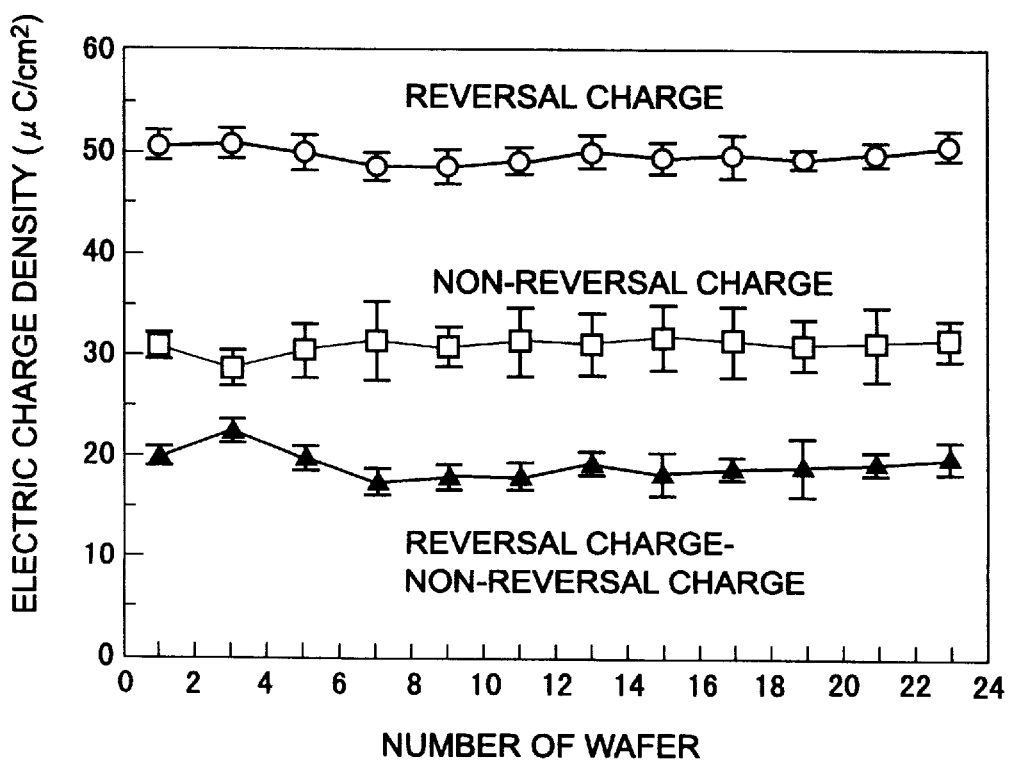
FIG. 9 is a graph showing the reproducibility of the capacitance characteristics of the PZT film formed in the first example of the present invention.

Here, as for the characteristics of the PZT film formed by sputtering at the above conditions, the surface distribution and the reproducibility will be described. FIG. 8 shows surface distributions of reversal charges, non-reversal charges and the difference between them in the PZT film obtained by a pulse measurement as a result that the capacitor characteristics was examined as to the distance from the center of the substrate. The distributions of those capacitor characteristics in the surface of the substrate are within 10% at the most so the surface distributions are considered good. FIG. 9 shows changes of the capacitor characteristics when a large number of wafers was successively treated, that is, shows the reproducibility. Error bars in FIG. 9 show the surface distributions in respective substrates. Although the characteristics are somewhat unstable to the extent of the fifth sheet from the start of sputtering, the capacitance characteristics can stably be provided after that. Such unevenness of the capacitance characteristics in the beginning of the film formation operation can easily be avoided by treating dummy wafers to the extent of 5 sheets in the beginning of the film formation operation if need. The film formation operation in a good reproducibility and a good productivity becomes possible after that.

The substrate after completing the formation of the PZT layer is successively placed at the formation of the upper electrode iridium layer. The substrate after completing the formation of the PZT layer in the ferroelectric layer formation chamber 5 is put in the upper electrode formation chamber 6 through the substrate transfer chamber 2. In this example, a direct-current sputtering apparatus of the target of iridium was used as the upper electrode formation chamber 6. The iridium layer was formed into about 200 nm thickness by the sputtering apparatus. For preventing the lack of oxygen in the surface of the ferroelectric layer, a mixture gas of $Ar/O_2$ (10%) was used as the sputtering gas in the beginning of the formation of the upper electrode and then the sputtering gas was changed to only argon. Accordingly, it is considered that the initially deposited layer of the upper electrode consists of iridium oxide or a mixture of iridium and iridium oxide. But because iridium oxide is conductive, there is no affection to the electric performance.

Although the layered structure of the lower electrode 18, ferroelectric layer 19 and upper electrode 20 is completed by the above process, in the above process, the atmosphere in the vicinity of the substrate is not a vacuum but kept at a fixed pressure for the duration after completing the formation of the ferroelectric layer till starting the formation of the upper electrode. The ferroelectric layer 19 exposed to the atmosphere is thereby prevented from changing the composition. That is, each of the ferroelectric layer formation chamber 5, substrate transfer chamber 2 and upper electrode formation chamber 6 on the route of transferring the substrate after completing the formation of the ferroelectric layer is kept at a fixed pressure by introducing an inert gas or the like while the substrate is present therein. In this example, an argon gas to which oxygen was added by 10% was introduced into each of the film formation chambers and substrate transfer chamber to control the pressure.

Here, the value of the pressure necessary for the prevention of the composition change will be described. In the conditions of the film formation in this example, a pressure of at least not less than $10^{-4}$ Torr was required for obtaining a full effect of preventing the composition change. When the established pressure was less than $10^{-4}$ Torr, the electric performance of the ferroelectric capacitor was deteriorated and the affection of the composition change in the surface portion of the ferroelectric layer appeared. The lower limit of the necessary pressure value depends on the film formation temperature of the ferroelectric layer. In the case of forming the film at a high temperature, a high pressure is required because coming-off from the surface of the film becomes active. Besides, the lower limit of the pressure strongly depends on the kind of the ferroelectric substance. Because PZT used in this example contains lead which has a high vapor pressure, a relatively high pressure is required for preventing it from coming off. On the other hand, from the viewpoint of preventing the composition change, the upper limit of the pressure is not critical. Therefore, the upper limit may be determined properly from the capacitance of the vacuum pump or the like employed in the apparatus. In the evacuating system of a general apparatus including the case of the film formation apparatus used in this example, the upper limit of the pressure of an introduced gas which can be maintained is the extent of 10 Torr. In consideration of the load on the vacuum pump, it is desirable that the upper limit is not more than 1 Torr. Thus in this and the below examples, the pressure was controlled into $10^{-3}$ Torr in order to obtain a full effect of preventing the composition change and lower the load on the apparatus within the above pressure range.

The layered structure of the upper electrode 20/ferroelectric layer 19/lower electrode 18/close adhesion layer 17 formed in the whole area of the substrate by the above process is patterned so that the portion other than the portion used as the ferroelectric capacitor is removed. In this example, the patterning process was performed separately into two stages in which the upper electrode 20 and the ferroelectric layer 19 were patterned in the first stage and the lower electrode 18 and the close adhesion layer 17 were patterned in the second stage, respectively.

Figure 4:
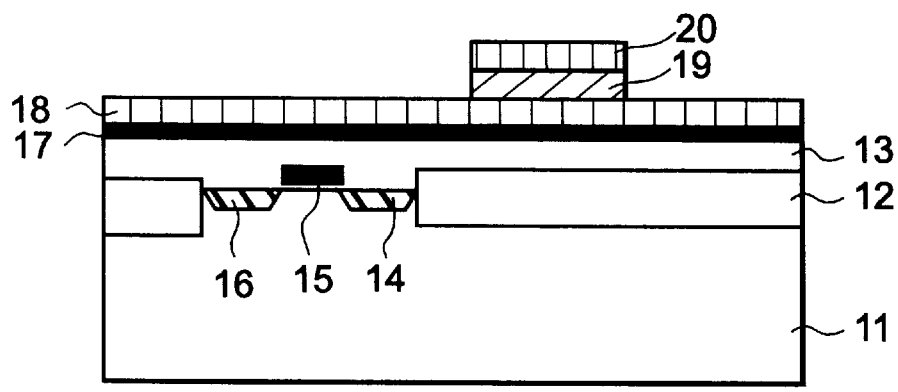
FIG. 4 is a cross-sectional view of the semiconductor device in a manufacturing step in the first example of the present invention.
Figure 5:
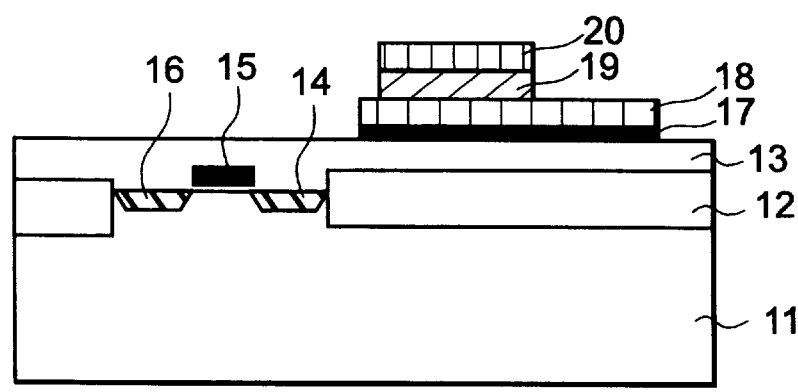
FIG. 5 is a cross-sectional view of the semiconductor device in a manufacturing step in the first example of the present invention.

In the first stage of the patterning process, a resist was applied onto the upper surface of the substrate. After the resist was processed into a predetermined pattern by a photolithography process, the upper electrode 20 and the ferroelectric layer 19 were processed by using the resist as a mask and then the resist was removed. The patterning operation in the second stage was performed in the similar manner and the lower electrode 18 and the close adhesion layer 17 were processed. FIGS. 4 and 5 show the cross sections when the patterning operations in the first and second stages are completed, respectively. By the above patterning process, the ferroelectric capacitor was formed at the position distant from the transistor portion formed on the substrate. Besides, the lower electrode 18 of the capacitor was left in a broader area than the ferroelectric layer 19 and the upper electrode 20.

By the above patterning process employed in this example, the surface of the ferroelectric layer 19 is not exposed to contaminants such as the resist and the plasma upon etching. By this manner, it becomes possible perfectly to prevent the affection such as the deterioration of the electric performance due to the contamination of the surface of the ferroelectric layer and to draw out the original ferroelectric performance of the ferroelectric layer.

Figure 6:
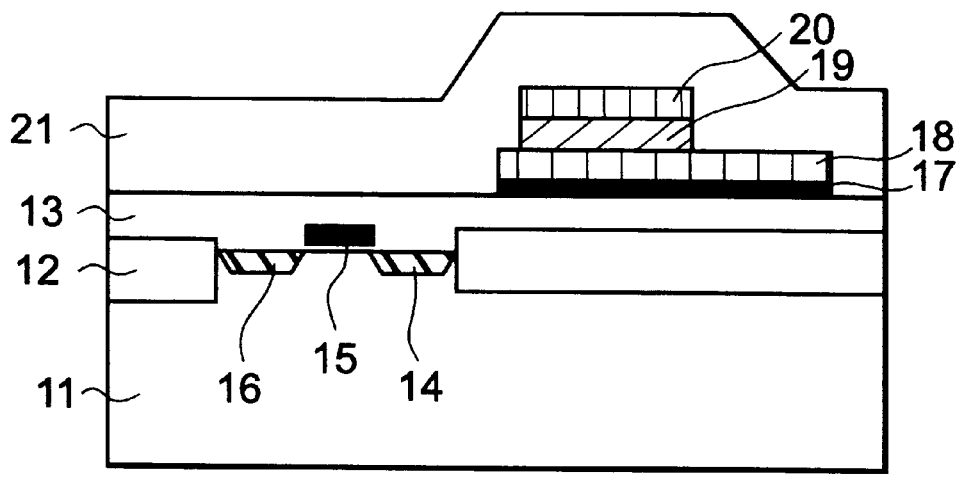
FIG. 6 is a cross-sectional view of the semiconductor device in a manufacturing step in the first example of the present invention.

Next, a capacitor cover insulator 21 is formed on the ferroelectric capacitor (FIG. 6). For the capacitor cover insulator 21, for instance, $SiO_2$ is used. The formation of the capacitor cover insulator 21 is desirably by a process in which it is hard to generate hydrogen. The reason is as follows. If hydrogen is present in the atmosphere upon forming the capacitor cover insulator, there is a case that hydrogen reduces the ferroelectric layer of the composite metal oxide to cause a deterioration of the capacitor performance. For the process of forming the capacitor cover insulator, this example employed a thermal CVD method using ozone ($O_3$) and tetraethylorthosilicate (TEOS) as the reaction materials. The thickness of the capacitor cover insulator 21 was 500 nm.

Figure 7:
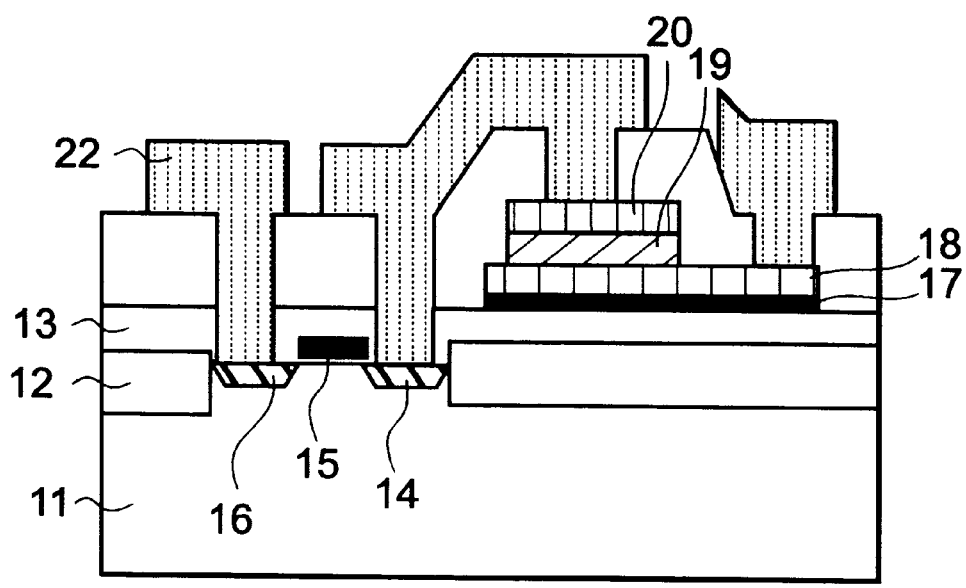
FIG. 7 is a cross-sectional view of the semiconductor device in a manufacturing step in the first example of the present invention.

At the last, wiring layers for connecting the transistor, the ferroelectric capacitor and an external circuit to each other are formed. Holes are formed in the capacitor cover insulator 21 by patterning to expose the diffusion layers 16 of the transistor and the upper electrode 20 and lower electrode 18 of the ferroelectric capacitor. An aluminum layer is formed by a conventional manner so that the holes are filled up. The aluminum layer is then patterned so that one of the diffusion layers 16 of the transistor is connected to the external circuit, the other of the diffusion layers 16 to the upper electrode 20 of the ferroelectric capacitor and the lower electrode 18 to the external circuit. A semiconductor memory device including the ferroelectric capacitor is thereby completed (FIG. 7). Although the contact holes must be formed in that process of wiring, in the capacitor structure of the present invention, any portion of the ferroelectric layer is exposed to the plasma upon etching for forming the contact holes. Therefore, there is no damage by the plasma.

Although the formed PZT layer was used as the dielectric layer as it was in this example, it may be used as the dielectric layer after a thermal treatment. Such a thermal treatment after a ferroelectric film is formed is general and has an effect of improving the electric performance of the film by crystallizing parts which had not completely been crystallized at the formation of the film. For the atmosphere of the thermal treatment, an inert gas such as argon and nitrogen or an oxygen gas is used. It is desirable that the atmosphere contains oxygen for preventing coming-off of oxygen in the thermal treatment. In the case of performing the thermal treatment in this example, it is desirable to perform the thermal treatment after patterning the capacitor portion and before forming the cap layer for preventing peeling-off or the like due to generation of the stress in the PZT layer. Typical conditions of the thermal treatment are the atmosphere of oxygen (100%) at an atmospheric pressure, 600° C. and 30 minutes. Other than this, it is of course possible to apply a rapid thermal annealing method using lamp heating or the like.

In this example, only the close adhesion layer was formed in another apparatus and then the lower electrode, ferroelectric layer and upper electrode were successively formed in the apparatus of FIG. 1. But a successive formation also including the close adhesion layer is of course possible. In that case, by connecting a sputtering apparatus to, for instance, the treatment chamber 3 of the apparatus of FIG. 1 as a film formation chamber for forming the close adhesion layer, it becomes possible successively to form the layered structure including the close adhesion layer in the atmosphere isolated from the air. In the case of the close adhesion layer 17 of iridium oxide and the lower electrode 18 of iridium as this example, both of them may successively be formed in one film formation chamber. For instance, when sputtering is performed in the lower electrode formation chamber 4, a mixture gas of argon and oxygen is used as the sputtering gas in the beginning of formation to form an $IrO_2$ layer and then only argon is used as the sputtering gas to form an Ir layer. In this manner, the layered structure of $Ir/IrO_2$ can be formed in the apparatus of FIG. 1 without adding another film formation chamber. Furthermore, it is also possible to form the upper electrode of iridium in the lower electrode formation chamber. In the case of successively forming the layered structure also including the close adhesion layer 17 by the above manner, it is possible to prevent also the boundary surface between the close adhesion layer 17 and the lower electrode 18 from being contaminated. But because the purification of the boundary surface between the close adhesion layer 17 and the lower electrode 18 hardly affects the electric performance of the ferroelectric capacitance, there is no problem in the case of forming only the close adhesion layer 17 in another apparatus.

EXAMPLE 2

In example 2, the high-frequency electric power applied upon forming a PZT film used as the ferroelectric layer by sputtering was small in the beginning of the formation and then increased. The apparatus used in this example, the structure of the made semiconductor device and the steps other than the formation of the PZT layer are all the same as those in the example 1. Hereinafter, conditions for forming the PZT layer in this example will be described.

Figure 10:
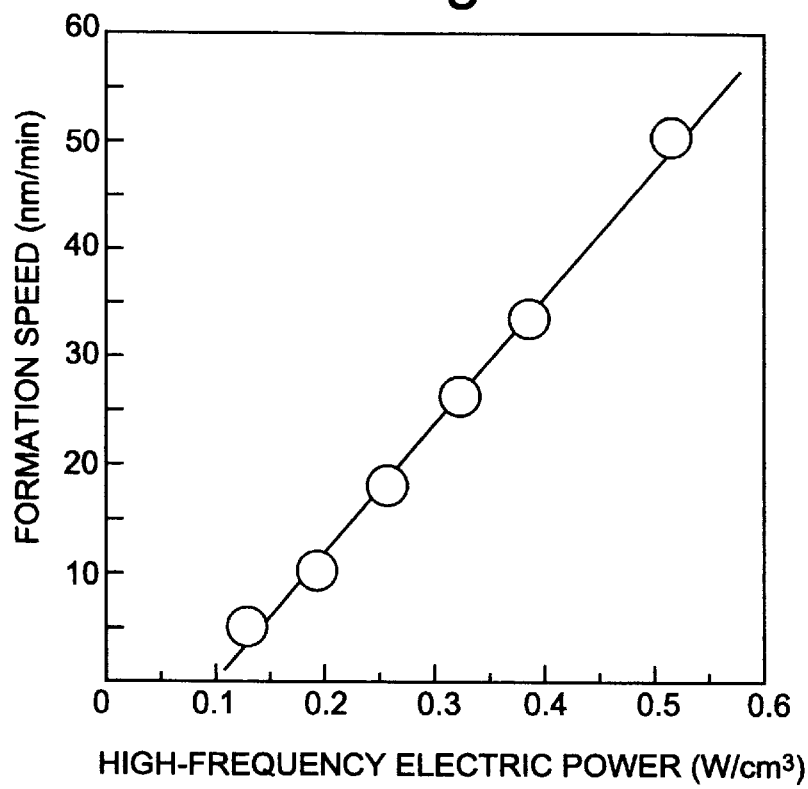
FIG. 10 is a graph showing the relationship between the high-frequency electric power and the formation speed when a PZT film is formed by a sputtering method.

The high-frequency electric power upon forming the PZT layer strongly affects the formation speed and the quality of the film. FIG. 10 shows the change of the formation speed to the high-frequency electric power when the PZT layer is formed by sputtering in the film formation apparatus of FIG. 1. For instance, comparing the cases of forming PZT films by the high-frequency electric powers of 1 kW (the electric power density of 0.129 $kW/cm^3$) and 4 kW (the electric power density of 0.516 $kW/cm^3$), the formation speed is about 6 nm/minute at 1 kW but increases to about 50 nm/minute at 4 kW and the productivity is improved. On the other hand, as for the crystallinity and so on particularly in the boundary surface to the underlayer of the obtained film, the case of forming at a low formation speed by a low electric power is superior. The crystallinity in the boundary surface to the underlayer is very important from the viewpoints that the ferroelectric layer grows on the boundary surface inherits the crystallinity from the boundary surface and the capacitor performance considerably depends on it.

Based on the above, by performing a film formation by a low electric power only in the beginning of the formation and by a high electric power after that, it becomes possible to form a ferroelectric layer with a good crystallinity of the boundary surface to the underlayer, a sufficient formation speed and a high productivity. For this purpose, it is desirable to perform the film formation in the beginning at a formation speed not more than about 10 nm/minute. In this example, the high-frequency electric power was controlled into 1 kW only in the beginning of the formation of the PZT layer and increased to 4 kW after about 2 minutes. The other conditions for the film formation were the same as those of the example 1. The thickness of the PZT layer was 200 nm which was the same as that of the example 1.

In the semiconductor device made in this example, the ferroelectric capacitor showed a good electric performance similarly to that of the example 1. On the other hand, the time for forming the PZT layer can be shortened to about 6 minutes from about 30 minutes in the case of the example 1. That is, by the manufacturing method of this example, it became possible to increase the formation speed with keeping the electric performance good and improving the productivity.

Although the formation speed was controlled by controlling the high-frequency electric power in the sputtering method in this example, a similar effect can be obtained by another method. That is, utilizing that a film formed at a low formation speed tends to be superior in crystallinity in general, a similar effect to that of this example can also be obtained by the following method. For instance, when the ferroelectric layer is formed by a CVD method, the supply of the material is controlled to small only in the beginning and then increased.

EXAMPLE 3

In this example, there will be described a case that a ferroelectric layer 19 was formed at a low temperature and then annealed to change in phase. It is known that PZT used in this example for the ferroelectric layer is a paraelectric substance in pyrochlore structure when it is formed at a low temperature. For obtaining the ferroelectric phase in perovskite structure, other than the formation at a temperature more than the extent of 600° C. as performed in the examples 1 and 2, a method is possible that a film in pylochlore structure obtained by a formation at a low temperature is changed in phase by annealing at a temperature more than the extent of 600° C. A method of the present invention is also effective for such a formation of a ferroelectric layer by a low-temperature formation and an annealing process.

The final structure of a semiconductor device made in this example is the same as that of the example 1. In the manufacturing process, from the formation of the transistor portion on the semiconductor substrate (FIG. 2) to the patterning step of the ferroelectric capacitor portion (FIG. 5) are the same as those of the example 1. But in the forming step of the PZT layer for the ferroelectric layer 19, the formation temperature is lower than 600° C. in the example 1. After the patterning process of the ferroelectric capacitor portion is completed as shown in FIG. 5, it is annealed in an oxygen atmosphere. In this example, the annealing conditions were the substrate temperature of 600° C., the atmosphere of 100% oxygen, the pressure of one atmospheric pressure and the time of 10 minutes. Successively from this oxygen annealing process, the formation of the capacitor cover layer (FIG. 6) and the formation of the wiring layers (FIG. 7) are performed similarly to those in the example 1 to complete the semiconductor device.

In the case that the PZT film formed at a low temperature is changed in phase to perovskite structure by annealing at a high temperature, the quality of the film, the orientation property of the crystallization and the electric performance widely change according to the substrate temperature upon formation. Hereinafter, the change of the orientation property will be described in particular. The change of the orientation property described below is obtained as a result of measuring a PZT layer formed in the whole area of the substrate.

Figure 11:
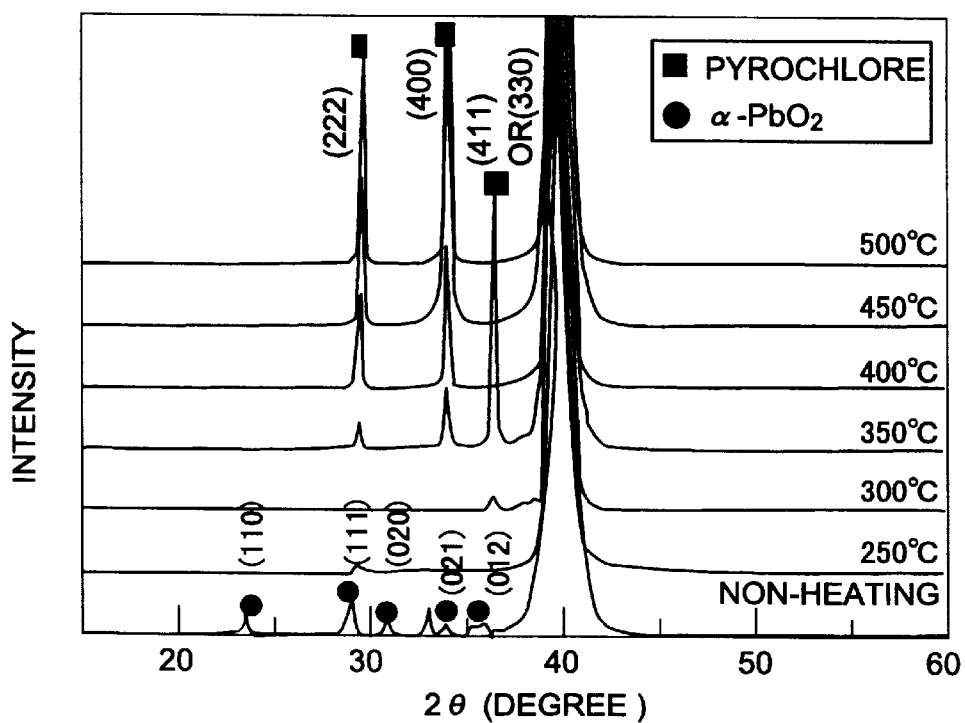
FIG. 11 is a graph showing the change of the X-ray diffraction spectrum of a PZT film formed as the substrate temperature is changed in the third example of the present invention.

FIG. 11 shows an X-ray diffraction spectrum immediately after the formation of the film (before annealing) when the substrate temperature upon formation is changed. The X-ray source employed Kfz line of copper. As for the non-heating formation, there is observed only a diffraction peak supposed to be $f\dot{\iota}$-PbO$_2$. As for the formations at 250° C. and 300° C., there are observed few diffraction peaks. Therefore, in the case of forming at a substrate temperature not more than 300° C., it is considered that the film never has a structure of composite oxide containing all of lead, zirconium and titanium and it is in non-crystallization state as composite oxide. In the cases of the formations at substrate temperatures not less than 350° C., there are observed diffraction peaks all of which can be explained as pyrochlore phase. From the intensity ratio of the peaks of pyrochlore phase changing according to the substrate temperature, it is found that the orientation property of the crystallization changes according to the substrate temperature upon the formation of the film. The changes are arranged in FIG. 12. The horizontal axis represents the substrate temperature upon formation and the vertical axis represents the composition ratio of the peak intensity from each diffraction surface.

Figure 13:
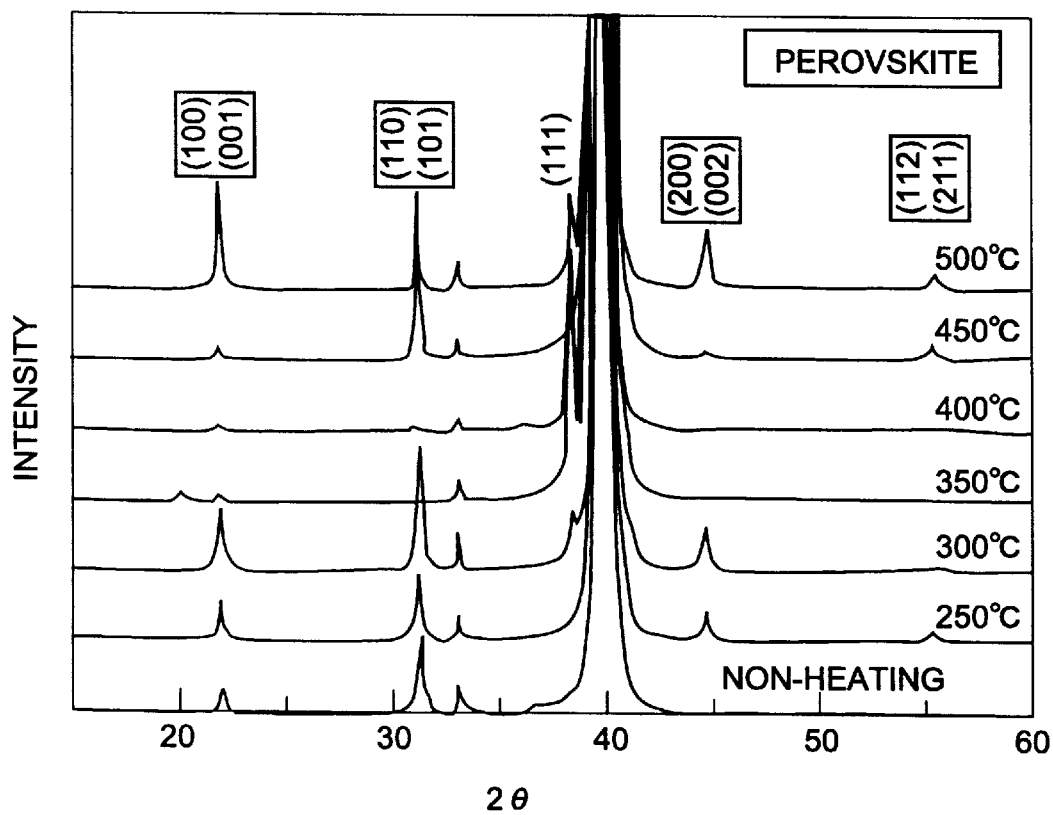
FIG. 13 is a graph showing the change of the X-ray diffraction spectrum of the PZT film formed as the substrate temperature is changed and then annealed in the third example of the present invention.
Figure 14:
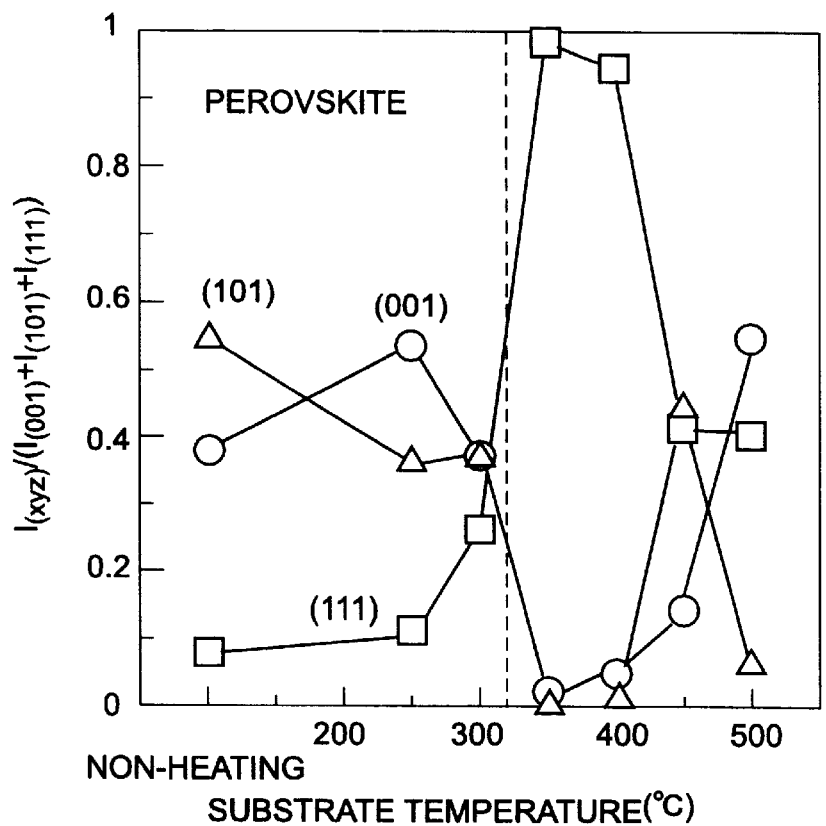
FIG. 14 is a graph showing the changes of the intensities of principal peaks of the X-ray diffraction spectrum of the PZT film formed as the substrate temperature is changed and then annealed in the third example of the present invention.

On the other hand, FIG. 13 shows an X-ray diffraction spectrum after annealing in an oxygen atmosphere at 600° C. when the substrate temperature upon formation is changed. As for all samples including the case of being in non-crystallization before annealing, there are observed peaks caused by perovskite structure. Besides, after annealing, there is observed no diffraction peak by a cause other than the PZT in perovskite structure. But the orientation property of the PZT film after annealing changes according to the formation temperature. FIG. 14 is an arrangement of the changes of each peak intensity caused by perovskite structure according to the formation temperature. Although the perovskite PZT is considered tetragonal, because the lattice constants in the a-axis direction and the c-axis direction are near to each other, their peaks could not be separated. Thus in FIGS. 13 and 14, (100) and (001) are together represented by (001) and (110) and (101) are together represented by (101).

Figure 12:
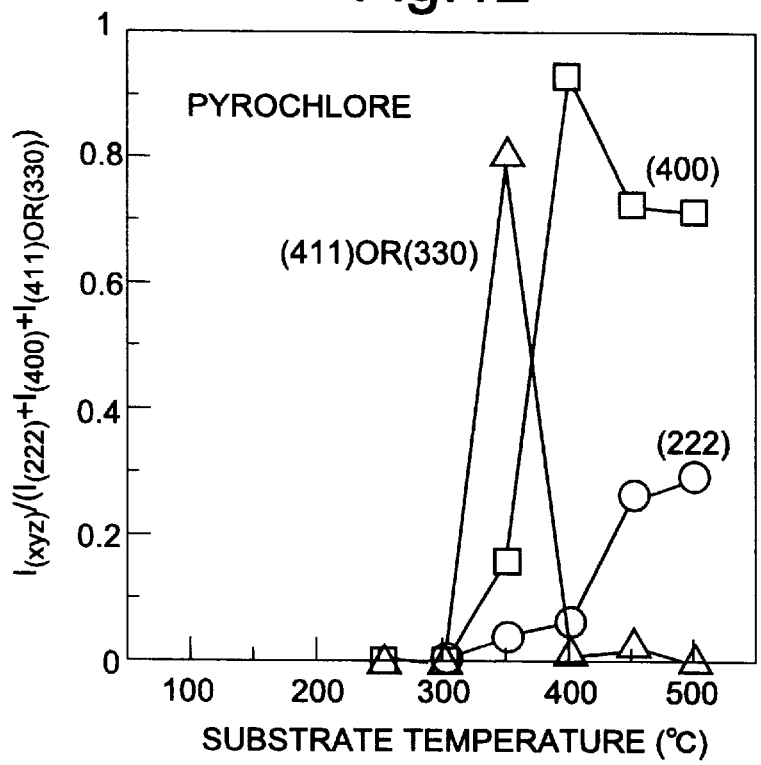
FIG. 12 is a graph showing the changes of the intensities of principal peaks of the X-ray diffraction spectrum of the PZT film formed as the substrate temperature is changed in the third example of the present invention.

Comparing FIG. 14 with FIG. 12, it is obvious that the orientation property of the PZT film in perovskite structure after annealing has a correlation with the substrate temperature upon formation, that is, the orientation property in pyrochlore structure before annealing. In the case of forming at a substrate temperature not more than 300° C., composite metal oxide of the obtained film is in non-crystallization. After annealing, it changes to a perovskite PZT film in non-orientation by irregular crystallization. The electric performance of the PZT film in that case is inferior due to a large leak current and so on. In the case of a substrate temperature of 300 to 450° C. upon formation, a pylochlore film of the orientation of (411), (330) or (400) is obtained. After annealing, it changes to a perovskite PZT film in which the orientation of (111) is dominant. In the case of a formation temperature more than 450° C., the orientation of (222) is dominant in pylochlore structure and the orientation of (001) is dominant in perovskite structure after annealing.

Hereinabove, there has been described the relationship between the formation temperature and the orientation property of the PZT film after oxygen annealing. The polarization axis of PZT in perovskite structure is in (001) direction. A PZT film of the orientation of (001) is therefore desirable when it is used for the dielectric layer of a ferroelectric capacitor. In this example, the substrate temperature upon forming a PZT layer was controlled to 530° C. so as to form a pylochlore layer in which the orientation of (222) was dominant. The layer was then annealed in an oxygen atmosphere to obtain a perovskite PZT layer in which the orientation of (001) was dominant. The PZT layer formed at those conditions was also good in flatness. The leak current performance measured after forming a ferroelectric capacitor structure was not more than $10^{-6}$ A/cm$^2$ upon applying 10 V, which was sufficient for practical use.

According to the method of this example, it became possible to form a PZT layer at a lower substrate temperature than conventional. Because the substrate temperature upon formation is low, it is possible to decrease coming-off of composing elements from the substrate surface after formation. Although annealing was performed at 600° C. in this example, the annealing temperature may be changed within a fixed range. The lower limit of the temperature range is determined from the temperature at which the phase changes from pylochlore structure to perovskite structure. The upper limit is determined from the temperature at which coming-off of lead from the PZT layer can be ignored when the annealing temperature is increased. The above-mentioned phase change temperature depends on the composition of PZT, that is, the ratio of Zr/Ti. Although an annealing temperature of 580 to 800° C. was effective for the PZT composition used in this example, the lower limit temperature may appropriately be changed when PZT of a different composition is used. In general, because the phase change temperature tends to lower as increasing the content of Ti in PZT, the lower limit of the annealing temperature also lowers.

Besides, by controlling the orientation of the PZT layer in pylochlore structure obtained by a low-temperature formation by changing the formation temperature and inheriting it to perovskite structure after annealing, the orientation of the PZT layer can easily be controlled. The substrate temperature was controlled to 530° C. to obtain the perovskite PZT layer of the orientation of (001) in this example. But if PZT of the orientation of (111) is desirable, it is formed at a substrate temperature of 300 to 450° C. and then an oxygen annealing process is performed.

In the case of forming the PZT layer by sputtering with changing the substrate temperature, there is a case that the composition of the layer changes. In particular, the Pb content in the PZT layer tends to decrease with increase of the substrate temperature. In that case, by optimizing the Pb content in the sputtering target to the formation temperature, a PZT layer having the stoichiometric composition can be obtained at any substrate temperature.

EXAMPLE 4

In this example, a semiconductor device having a structure different from those of the examples 1 to 3 was made.

Figure 15:
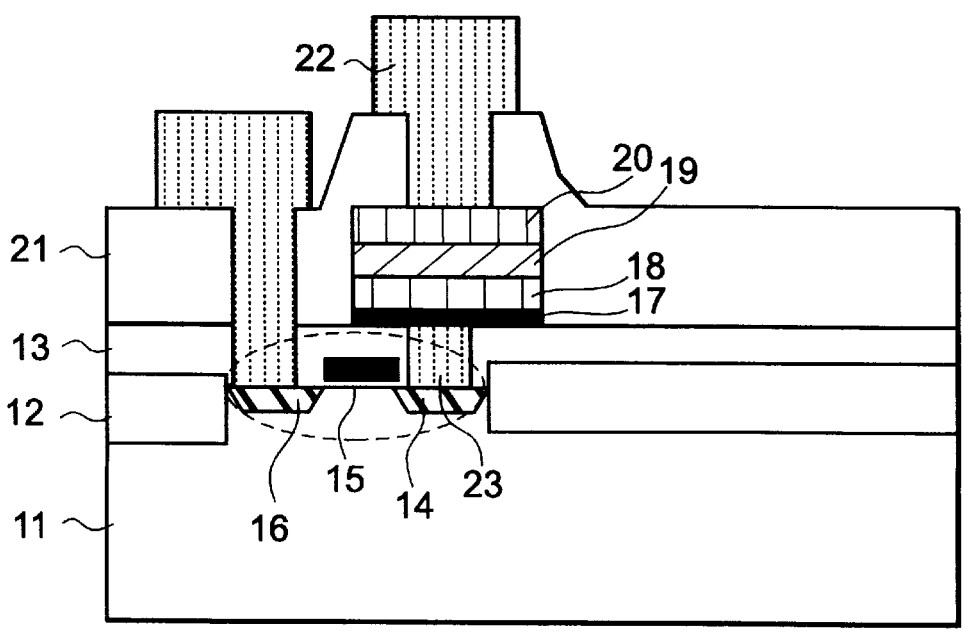
FIG. 15 is a cross-sectional view of the final structure of a semiconductor device manufactured in the fourth example of the present invention.
Figure 16:
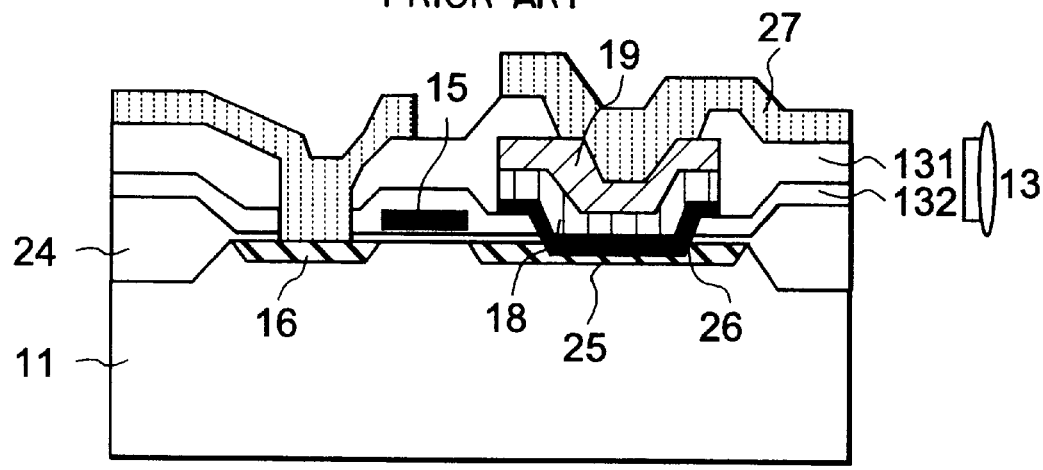
FIG. 16 is a cross-sectional view of a semiconductor device of the first prior art.
Figure 17:
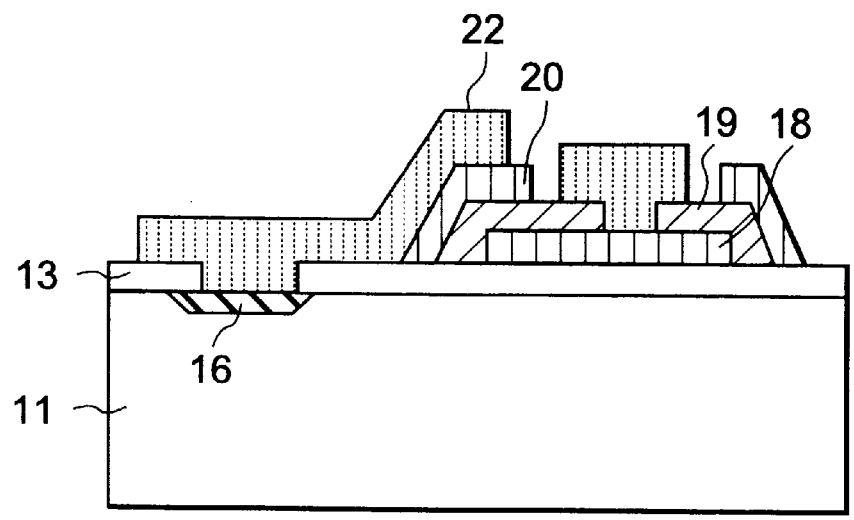
FIG. 17 is a cross-sectional view of a semiconductor device of the second prior art.

FIG. 15 shows a cross section of the final structure of the semiconductor device made in this example. In the semiconductor device of this example, a ferroelectric capacitor is disposed immediately above one of diffusion layers of a transistor. The diffusion layer 16 is electrically connected to the lower electrode 18 of the ferroelectric capacitor through a close adhesion layer 17 by a plug 23. The material of the plug 23 was polysilicon. The other structural parts used the same materials as those in the examples 1 to 3. Although the close adhesion layer 17 had to be made of a conductive material in the structure of this example, there was no problem because iridium oxide is conductive.

Hereinafter, the manufacturing method of this example will be described. From the formation of the transistor on the silicon substrate to the forming step of the inter-layer insulator are the same as those in the example 1. After forming the inter-layer insulator 13, a part of it is opened by a photolithographing and etching process to expose one of the diffusion layers 16 therein. After forming a polysilicon layer so that the opening of the inter-layer insulator 13 is filled up, the part of the polysilicon layer other than the filling-up portion is removed by etching back to form the plug 23. After this, the layered structure of the upper electrode 20/ferroelectric layer 19/lower electrode 18/close adhesion layer 17 is formed by the same process as that in the example 1. Next, a resist is left on the portion, on which the capacitor is to be formed, by a photolithography process and from the upper electrode to the close adhesion metal are processed by using the resist as a mask. As shown in FIG. 15, in the case of this example, differently from the examples 1 to 3, because the upper electrode 20, the ferroelectric layer 19, the lower electrode 18 and the close adhesion layer 17 are left in the same region, the layered structure can be processed by one etching process. Successively, the capacitor cover layer 21 is formed. After forming contact holes therein, a wiring layer 22 is formed and processed to complete the semiconductor device.

According to the above manufacturing method of this example, because the layered structure can be patterned in a single stage, the productivity is more improved in comparison with the examples 1 to 3.

Also in this example, a thermal treatment after forming the ferroelectric capacitor portion is effective similarly to the example 1. Besides, it is needless to say that the method in which annealing is performed after forming the PZT layer at a low temperature to obtain a ferroelectric PZT layer by changing the phase as described in the example 3 is applicable also to this example.

In the above-described examples, the material used for each part can properly be changed. For instance, as for the examples 1, 2 and 4, PZT for the ferroelectric layer can be substituted by another ferroelectric substance such as $PbTiO_3$, PLZT and $SrBi_2Ta_2O_9$. Otherwise, PZT having a Zr/Ti ratio different from those of the examples may be used. The example 3 is applicable to such a material as pylochlore structure is obtained by a low-temperature formation and pevroskite structure is obtained by annealing at a high temperature. Iridium used for the upper/lower electrodes can be substituted by another metal such as platinum or conductive oxide such as iridium oxide and ruthenium oxide ($RuO_2$). Also in the case of an upper electrode made of a metal having an oxidation resistivity such as platinum, mixing $O_2$ with the sputtering gas in the beginning of forming the upper electrode by sputtering is effective for preventing the ferroelectric layer from changing in quality. The material for the close adhesion layer may also properly be changed when the material for the electrode is changed. For instance, in the case of the electrode of platinum, titanium (Ti) is effective for the close adhesion layer. In the case of the lower electrode of iridium oxide, the close adhesion layer may not be used.

Although the ferroelectric layer and upper/lower electrodes were all formed by sputtering in the examples, the film formation method of the present invention is not limited to the sputtering method. For obtaining the effect of the present invention, it is essential that the structure of the upper electrode/ferroelectric layer/lower electrode can be formed in the atmosphere isolated from the air. Therefore, the film formation method is not limited if the above condition is satisfied. For instance, the ferroelectric layer can be formed by a CVD method.

Furthermore, it is needless to say that the method of C successively forming the upper electrode/dielectric layer/lower electrode, the method of keeping the atmosphere after forming the dielectric layer at a predetermined pressure, the method of mixing oxygen with the sputtering gas in the beginning of forming the upper electrode by sputtering, and so on are applicable not only to the formation of the ferroelectric capacitor but also to the formation of a capacitor including the dielectric layer made of a substance having a high dielectric constant capacitance.

According to the above-described manufacturing methods of the present invention, the following effects can be obtained.

As a result of successively forming the upper electrode/dielectric layer/lower electrode in the atmosphere isolated from the air, it becomes possible to prevent contamination such as mixing of alien substances to the boundary surface. By keeping the atmosphere in the vicinity of the substrate after forming the dielectric layer at a predetermined pressure, it becomes possible to prevent the surface of the dielectric layer from changing the composition. For preventing the surface of the dielectric layer from changing the composition, it is also effective to mix oxygen with the sputtering gas in the beginning of forming the upper electrode. According to the present invention, the productivity is improved in comparison with a conventional method.

By forming the dielectric layer by sputtering at a low electric power in the beginning and at an increased electric mL power after that, it becomes possible to improve the productivity with keeping the crystallinity of the dielectric layer good.

In the case of the dielectric layer of PZT, by the two-stage formation method in which the formation is performed at a low temperature and then a thermal treatment at a high temperature is performed, it becomes possible to lower the temperature upon formation and prevent the composition change of the layer. In this method, there is also an effect that the orientation property of the ferroelectric PZT layer can easily be controlled.

As a result of the above, in a semiconductor device in which a ferroelectric substance or a substance having a high dielectric constant capacitance is used for the dielectric layer of a capacitor, remarkable effects are obtained that the improvements of the electric performance and the reliability are attained by preventing the contamination and the composition change of the surface of the dielectric layer and it becomes possible to improve the productivity at the same time.

What is claimed is:

1. A method for manufacturing a semiconductor device which has a capacitor including a layered structure of a lower electrode layer, a ferroelectric layer made of a composite metal oxide and an upper electrode layer in a predetermined region on a semiconductor substrate, comprising:

forming said lower electrode layer above a semiconductor substrate in a lower electrode forming apparatus;

transferring said semiconductor substrate from said lower electrode forming apparatus to a ferroelectric layer forming apparatus;

forming said ferroelectric layer on said lower electrode layer in said ferroelectric layer forming apparatus;

transferring said semiconductor substrate from said ferroelectric layer forming apparatus to an upper electrode forming apparatus without exposing to air; and forming said upper electrode layer on said ferroelectric layer in said upper electrode forming apparatus, wherein, at least in duration after forming said ferroelectric layer and until starting forming said upper electrode layer, a gas is introduced into the atmosphere in the vicinity of said substrate to keep the atmosphere within a predetermined pressure range.

2. A method for manufacturing a semiconductor device according to claim 1, further comprising a step of patterning said layered structure so that said layered structure is processed by etching and left only in a region used for the capacitor, following said step of forming said upper electrode layer.

3. A method for manufacturing a semiconductor device according to claim 2, further comprising a step of performing a thermal treatment in an atmosphere of oxygen, an inert gas or a mixture gas of oxygen and an inert gas, after said step of patterning.

4. A method for manufacturing a semiconductor device according to claim 1, wherein said gas to be introduced into the atmosphere in the vicinity of said substrate consists of an inert gas or a mixture gas of an inert gas and oxygen.

5. A method for manufacturing a semiconductor device according to claim 1, wherein said predetermined pressure range is within the range from $10^{-4}$ Torr to 10 Torr.

6. A method for manufacturing a semiconductor device according to claim 1, wherein said upper electrode layer is formed by a sputtering method and the sputtering gas contains oxygen in the beginning of forming said upper electrode layer.

7. A method for manufacturing a semiconductor device according to claim 1, wherein said composite metal oxide is a ferroelectric substance.

8. A method for manufacturing a semiconductor device according to claim 7, wherein said ferroelectric substance is lead titanate zirconate.

9. A method for manufacturing a semiconductor device according to claim 1, wherein said ferroelectric layer is formed by a sputtering method in a manner that a high-frequency electric power for forming said ferroelectric layer by sputtering is controlled to a low power in the beginning of the formation and then increased.

10. A method for manufacturing a semiconductor device according to claim 8, wherein said ferroelectric layer of lead titanate zirconate is formed at a substrate temperature at which pyrochlore structure is obtained, and then a thermal treatment is performed in an atmosphere of oxygen, an inert gas or a mixture gas of oxygen and an inert gas at a temperature higher than the substrate temperature upon forming said ferroelectric layer so that said ferroelectric layer changes in phase from said pyrochlore structure to perovskite structure.

11. A method for manufacturing a semiconductor device according to claim 10, wherein said substrate temperature upon forming said ferroelectric layer is within the range from 300° C. to 550° C. and said temperature for said thermal treatment is within the range from 580° C. to 800° C.

12. A method for manufacturing a semiconductor device, wherein a layer of lead titanate zirconate is formed at a substrate temperature at which pyrochlore structure is obtained, and then a thermal treatment is performed in an atmosphere of oxygen, an inert gas or a mixture gas of oxygen and an inert gas at a temperature higher than the substrate temperature upon forming said layer so that said film changes in phase from said pyrochlore structure to perovskite structure.

13. A method for manufacturing a semiconductor device according to claim 12, wherein said substrate temperature upon forming said layer is within the range from 300° C. to 550° C. and said temperature for said thermal treatment is within the range from 580° C. to 800° C.

14. A method for manufacturing a semiconductor device which has a capacitor including a layered structure of a lower electrode layer, a ferroelectric layer made of a composite metal oxide and an upper electrode layer in a predetermined region on a semiconductor substrate, comprising:

forming said lower electrode layer above a semiconductor substrate in a lower electrode forming apparatus;

transferring said semiconductor substrate from said lower electrode forming apparatus to a substrate exchange chamber;

transferring said semiconductor substrate from said substrate exchange chamber to a ferroelectric layer forming apparatus;

forming said ferroelectric layer on said lower electrode layer in said ferroelectric layer forming apparatus;

transferring said semiconductor substrate from said ferroelectric layer forming apparatus to said substrate exchange chamber;

transferring said semiconductor substrate from said substrate exchange chamber to an upper electrode forming apparatus; and forming said upper electrode layer on said ferroelectric layer in said upper electrode forming apparatus;

wherein a pressure of said ferroelectric layer forming apparatus and that of said substrate exchange chamber is substantially equal during transferring said semiconductor substrate from said ferroelectric layer forming apparatus to said substrate exchange chamber, wherein, at least in duration after forming said ferroelectric layer and until starting forming said upper electrode layer, a gas is introduced into the atmosphere in the vicinity of said substrate to keep the atmosphere within a predetermined pressure range.

15. The method as claimed in claim 14, wherein a pressure of said substrate exchange chamber and that of said upper electrode forming apparatus is substantially equal during transferring said semiconductor substrate from said substrate exchange chamber to said upper electrode forming apparatus.

16. The method as claimed in claim 14, wherein said ferroelectric layer is formed from one of $PbTiO_3$, PLZT and $SrBi_2Ta_2O_9$.

17. The method as claimed in claim 14, wherein a sputtering gas including oxygen is used during forming said ferroelectric layer.

18. The method as claimed in claim 14, wherein a sputtering gas including oxygen is used at a start of forming said upper electrode layer.

19. The method as claimed in claim 18, wherein after the start, said sputtering gas changes from inert gas including oxygen to inert gas only.

20. The method as claimed in claim 14, wherein an inert gas including oxygen is introduced into said ferroelectric layer forming apparatus and said substrate exchange chamber when said semiconductor substrate is transferred from said ferroelectric layer forming apparatus to said substrate exchange chamber.

21. The method as claimed in claim 14, wherein said forming ferroelectric layer includes forming said ferroelectric layer of a pyrochlore structure on said lower layer, and exchanging said pyrochlore structure to perovskite structure by annealing.

22. A method for manufacturing a semiconductor device which has a capacitor including a layered structure of a lower electrode layer, a ferroelectric layer made of a composite metal oxide and an upper electrode layer in a predetermined region on a semiconductor substrate, comprising:

forming said lower electrode layer above a semiconductor substrate;

forming said ferroelectric layer on said lower electrode layer with a high-frequency electric power, an electric power of said high-frequency electric power at a start of forming said ferroelectric layer is lower than that at an end of forming said ferroelectric layer; and forming said upper electrode layer on said ferroelectric layer in said upper electrode forming apparatus, wherein, at least in duration after forming said ferroelectric layer and until starting forming said upper electrode layer, a gas is introduced into the atmosphere in the vicinity of said substance to keep the atmosphere within a predetermined pressure range.

23. The method as claimed in claim 22, wherein said ferroelectric layer is formed from one of $PbTiO_3$, PLZT and $SrBi_2Ta_2O_9$.

24. The method as claimed in claim 22, wherein a sputtering gas including oxygen is used during forming said ferroelectric layer.

25. The method as claimed in claim 22, wherein a sputtering gas including oxygen is used at the start of forming said upper electrode layer.

26. The method as claimed in claim 22, wherein after the start, said sputtering gas changes from inert gas including oxygen to inert gas only.

27. The method as claimed in claim 22, wherein an inert gas including oxygen is introduced into said ferroelectric layer forming apparatus and said substrate exchange chamber when said semiconductor substrate is transferred from said ferroelectric layer forming apparatus to said substrate exchange chamber.

28. The method as claimed in claim 22, wherein said forming ferroelectric layer includes forming said ferroelectric layer of a pyrochlore structure on said lower layer, and exchanging said pyrochlore structure to perovskite structure by annealing.

29. The method as claimed in claim 1, wherein said ferroelectric layer is formed from one of $PbTiO_3$, PLZT and $SrBo_2Ta_2O_9$.

30. The method as claimed in claim 1, wherein a sputtering gas including oxygen is used during forming said ferroelectric layer.

31. The method as claimed in claim 1, wherein a sputtering gas including oxygen is used at the start of forming said upper electrode layer.

32. The method as claimed in claim 31, wherein after the start, said sputtering gas changes from inert gas including oxygen to inert gas only.

33. The method as claimed in claim 1, wherein an inert gas including oxygen is introduced into said ferroelectric layer forming apparatus and said substrate exchange chamber when said semiconductor substrate is transferred from said ferroelectric layer forming apparatus to said substrate exchange chamber.

34. The method as claimed in claim 1, wherein said forming ferroelectric layer includes forming said ferroelectric layer of a pyrochlore structure on said lower layer, and exchanging said pyrochlore structure to perovskite structure by annealing.

* * * * *